United States Patent [19]
Kwasnick et al.

[11] Patent Number: 5,401,668
[45] Date of Patent: Mar. 28, 1995

[54] METHOD FOR FABRICATION SOLID STATE RADIATION IMAGER HAVING IMPROVED SCINTILLATOR ADHESION

[75] Inventors: Robert F. Kwasnick, Schenectady; Roger S. Ehle, Scotia; Richard J. Saia, Schenectady, all of N.Y.

[73] Assignee: General Electric Company, Schenectady, N.Y.

[21] Appl. No.: 115,084

[22] Filed: Sep. 2, 1993

[51] Int. Cl.[6] .................... H01L 2/302; G01T 1/20
[52] U.S. Cl. ........................................ 437/3; 437/241; 437/977; 250/370.11
[58] Field of Search .................. 437/2, 3, 241, 977; 250/208.1, 370.11

[56] References Cited

U.S. PATENT DOCUMENTS

| | | | |
|---|---|---|---|
| 4,906,850 | 3/1990 | Beerlage | 250/370.09 |
| 5,153,438 | 10/1992 | Kingsley et al. | 437/924 |
| 5,187,369 | 2/1993 | Kingsley et al. | 250/370.11 |
| 5,233,181 | 8/1993 | Kwasnick et al. | 250/208.1 |

Primary Examiner—Mary Wilczewski
Attorney, Agent, or Firm—Donald S. Ingraham; Marvin Snyder

[57] ABSTRACT

A method of fabricating a radiation imager with strong structural integrity and adhesion between the scintillator and photosensor array includes the steps of forming a photosensor array on a substrate; depositing a barrier layer over the photosensor array, the barrier layer having an upper surface of silicon nitride; treating the silicon nitride upper surface of the barrier layer to prepare the surface for the deposition of material thereover; and depositing a scintillator material over the treated upper surface of the barrier layer. The silicon nitride upper surface of the barrier layer is typically treated by etching the surface, such as in a reactive ion etch, for a selected amount of time, with less than about 500 Å of material being removed from the surface.

10 Claims, 1 Drawing Sheet

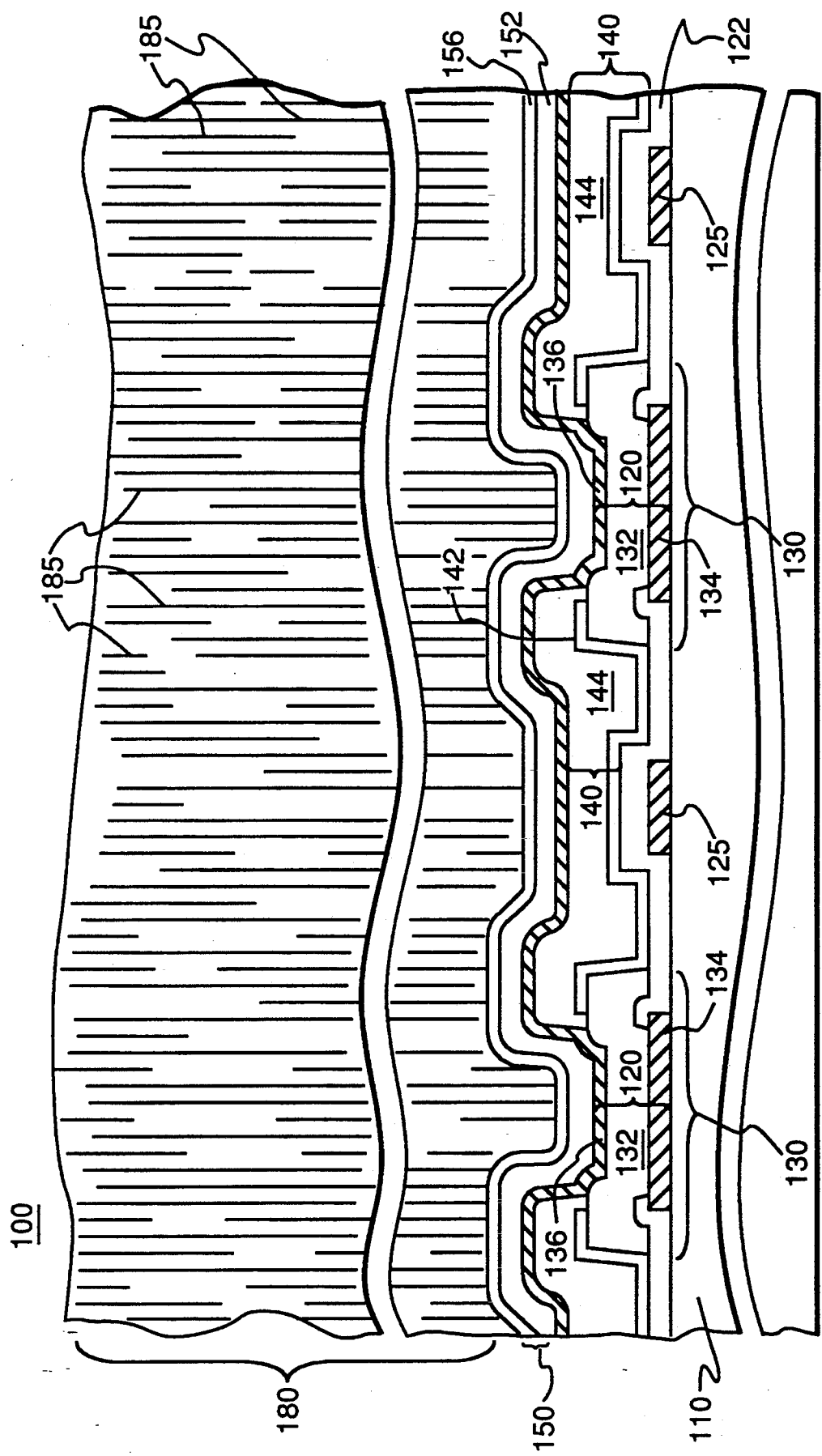

METHOD FOR FABRICATION SOLID STATE RADIATION IMAGER HAVING IMPROVED SCINTILLATOR ADHESION

RELATED APPLICATIONS

This application is related to application of R. F. Kwasnick, C. Wei, and J. Kingsley entitled "Solid State Radiation Imager With High Integrity Barrier Layer and Method of Fabricating," Ser. No. 08/099,370, filed 29 Jul. 1993, which application is a continuation-in-part of U.S. Pat. No. 5,233,181, issued 3 Aug. 1993, all of which are assigned to the assignee of the present invention and incorporated herein by reference.

BACKGROUND OF THE INVENTION

Solid state imagers, such as an x-ray imager typically include a photosensor array coupled to a scintillating medium. Radiation absorbed in the scintillator generates optical photons which in turn pass into a photosensor, such as a photodiode, in which the optical photon is absorbed and an electrical signal corresponding to the incident optical photon flux is generated. Substantially hydrogenated amorphous silicon (a-Si) is commonly used in the fabrication of photosensors due to the advantageous photoelectric characteristics of a-Si and the relative ease of fabricating such devices. In particular, photosensitive elements, such as photodiodes, can be formed in connection with necessary control or switching elements, such as thin film transistors (TFT's), in a relatively large array. The fabrication of such arrays is facilitated by the use of a-Si, which is used in the formation of both the TFT's and the photodiodes. Fabrication of the array is also facilitated by the deposition of a scintillator material directly over the photosensor array, but care must be taken to both protect the components of the photosensor array and ensure structural integrity of the scintillator/photosensor array assembly.

The performance of amorphous silicon based imagers can be degraded by a number of factors, including, for example, exposure to moisture (which can cause the leakage of a-Si photodiodes to increase irreversibly), exposure to materials, such as solvents used in the fabrication process, that degrade the electrical characteristics of the a-Si photodiode or may damage the polymeric dielectric materials, or by exposure to temperatures higher than those of the a-Si deposition processes (e.g., greater than about 250° C.). It is thus beneficial to provide a protective boundary for a-Si components to minimize degradation both in fabrication and during operation of the imager. A protective boundary disposed between the a-Si components of the photosensor array and the scintillator in an imager desirably provides 1) protection of the photosensor array from contamination by the scintillating medium (and vice versa); 2) a surface to which the scintillator material can adhere well; 3) good optical coupling between the scintillator and the underlying pixels in the imager array (that is, a high degree of transmission of the optical photons with a minimum of scattering of the photons); and, 4) a good environmental barrier to protect the photosensor array, especially from moisture.

Direct application of the scintillator material to the upper surface of the photosensor array, (either the common electrode or the barrier layer, if any, deposited to protect the array components) is the most efficient means of fabricating the imager assembly. In most imager devices, it is desirable to ensure a high degree of structural integrity between the scintillator and the upper surface of the photosensor array.

It thus an object of this invention to provide a method of fabricating an imager that provides for a robust structure having strong adhesion between the scintillator and the barrier layer.

It is a further object of this invention to provide a method of treating a barrier layer to improve adhesion to an overlying scintillator layer in a process that does not substantially adversely effect other exposed component materials in the array.

SUMMARY OF THE INVENTION

A method of fabricating an imager array in accordance with this invention includes the steps of forming a photosensor array having an upper conductive layer; depositing a barrier layer over the photosensor array, the upper exposed surface of the barrier layer comprising a silicon nitride layer; treating the exposed silicon nitride layer for a selected time to provide enhanced adhesion of the silicon nitride to a scintillator material to be deposited thereover; and depositing a scintillator material over the treated silicon nitride layer. The step of treating the silicon nitride to provide enhanced adhesion typically includes reactive ion etching the silicon nitride with a mixture of trifluoromethane, argon, and oxygen. The time of exposure to the reactive ion etching is selected such that not more than about 500 Å of silicon nitride material is removed from the surface the silicon nitride layer. In alternative embodiments, the step of treating the silicon nitride surface comprises ion bombardment or alternatively wet etching the silicon nitride.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which the sole FIGURE is a cross-sectional view of an imager array formed in accordance with one embodiment of the invention.

DETAILED DESCRIPTION OF THE INVENTION

A radiation imager 100 as illustrated in the FIGURE comprises a substrate 110 on which a photosensor array 120 is disposed, a photosensor array barrier layer 150 disposed over the photosensor array, and a scintillator 180 that is optically coupled to photosensor array 120. In accordance with the method of the present invention, barrier layer 150 comprises an upper silicon nitride surface which is treated to provide enhanced adhesion between barrier layer 150 and scintillator 180.

The process of forming a radiation imager in accordance with this invention includes the step of forming the photosensor array on the substrate, and details of the processes involved are disclosed in related applications Ser. No. 08/099,370, filed 29 Jul. 1993, which application is a continuation-in-part of U.S. Pat. No. 5,233,181, issued 3 Aug. 1993, which are both assigned to the assignee of the present invention and are incorporated herein by reference. Photosensor array 120 formed in this process comprises a plurality of photosensitive elements that are typically arranged in rows and columns on substrate 110. Alternatively, photosensor array 120 may be disposed over a dielectric layer (not shown) that covers substrate 110, as might be the case if other components are disposed on substrate 110 below the photosensor array. As used herein, "lower" or "bottom" are used interchangeably to refer to a relative position of a portion of imager array 100 closer in proximity to substrate 110, and "upper" or "top" are used interchangeably to refer to a relative position of a portion of imager array closer or farther from substrate 110; no operational or functional limitation on the orientation of the imager array is implied. Each photosensitive element typically comprises a photodiode 130 comprising a photosensor island 132 disposed over a bottom contact pad 134 and with an upper conductive layer 136 disposed over the assembly. Upper conductive layer 136 comprises a substantially transparent conductive material such as indium tin oxide or the like.

Photosensor island 132 comprises light absorptive semiconductive material such as substantially intrinsic hydrogenated amorphous silicon (a-Si), and may comprise bands (not shown) of silicon doped to show a selected conductivity (i.e., n-type or p-type) to provide the desired respective electrical contact to bottom contact pad 134 and upper conductive layer 136. Photosensor island is disposed between upper conductive layer 136 and bottom contact pad 134 such that a selected bias voltage is applied across the photosensor body. Consequently, charge generated by the absorption of optical photons in the semiconductive material is collected at a selected electrode that is periodically "read" or measured, at which time the bias voltage across the photodiode is reset to its selected value.

Each photodiode 130 is coupled to circuitry to allow charge collected on the photodiode to be read. Typically each photodiode is selectively coupled to a data line 125 by a respective thin film transistor (not shown); a dielectric layer 127 typically overlies the plurality of TFT's and data lines and provide electrical insulation between these components and overlying components, such as photodiode 130.

Photosensor array 120 advantageously comprises a passivation layer 140 which is disposed under upper conductive layer 136 except at points where upper conductive layer 136 is disposed in electrical contact with the upper surface of photosensor island 132. Passivation layer 140 comprises an inorganic moisture barrier layer 142 and an organic dielectric layer 144. Inorganic layer 142 typically comprises silicon nitride and is relatively thin, between about 0.01 micron and 0.5 micron; organic dielectric layer 144 typically comprises a polyimide, preferably a preimidized polyimide such as the Ciba-Geigy ® 200 series, and has a thickness between about 0.5 micron and 2.5 micron. Details pertaining to passivation layer appear in the application Ser. No. 07/891,117, filed 1 Jun. 1992, incorporated herein by reference.

Next, photosensor barrier layer 150 is formed over the upper conductive layer. The barrier layer is formed from a first stratum comprising silicon oxide deposited at a temperature less than about 250° C. (typically about 210° C.) and using tetraethoxysilane (TEOS) as the silicon source gas. The second stratum of silicon nitride is deposited over the first stratum in a PECVD process using a gas mixture of silane, ammonia, and nitrogen. The silicon oxide and silicon nitride are advantageously deposited during a single vacuum pumpdown of the array being fabricated.

As described in detail in copending application Serial No. Ser. No. 08/099,370, filed 29 Jul. 1993, which is incorporated herein by reference, photosensor barrier layer 150 is conformably disposed over upper conductive layer 136 and has a maximum thickness of about 3 microns or less. As used herein, "conformably disposed," "conformal," or the like refers to photosensor barrier layer 150 having a shape that is substantially similar to the contour of upper conductive layer 136, such that passivation layer 150 is disposed on upper conductor 136 and has a substantially uniform thickness along its length. Scintillator 180 is disposed over barrier layer 150 and is optically coupled to photosensor array 120 through the barrier layer. Barrier layer 150 is adapted to provide good optical coupling of photons between scintillator 180 and photosensor array 120 (that is, optical coupling with a high degree of transmission and with little or no scattering of the optical photons such as is provided by transparent dielectric materials without cracks). Commonly, barrier layer 150 has a thickness of in the range between about 0.5 μm and 1 μm.

Photosensor array barrier layer 150 typically comprises a first stratum (or layer) disposed adjacent to upper conductive layer 136 and a second stratum 156 disposed on first stratum 152, with scintillator 180 being disposed on second stratum 156. First stratum 152 comprises silicon oxide that has a typical thickness in a range between about 0.5 microns and 1.5 microns, and commonly has a thickness of about 0.7 microns. The silicon oxide comprising first stratum 152 is typically deposited in a plasma enhanced chemical vapor deposition (PECVD) process using TEOS as the silicon source gas at a temperature of less than about 250° C., providing a silicon oxide having a composition of $SiO_x$, wherein $1.5 < x < 2$, and hydrogen content is less than about 5% of the atoms. Silicon oxide deposited in this process conforms well to the underlying layer (i.e., step coverage is good over the contours of upper conductive layer 136) even while maintaining a deposition temperature of about 210° C. Additionally, the silicon oxide provides a robust moisture barrier and is resistant to solvents, such as gamma butyrolactone, which may be present in the array from the deposition of polyimide.

Second stratum 156 comprises silicon nitride having a typical thickness in a range between about 0.05 μm and 0.15 μm, and commonly has a thickness of about 0.1 μm. The silicon nitride comprising second stratum is deposited in a PECVD process at a temperature of about 210° C., and typically at a reduced frequency of about 50 KHz (as opposed the more commonly used PECVD frequency of 13.56 MHz). This process provides silicon nitride having a composition of $SiN_y$, wherein $1.0 < y < 1.33$, and hydrogen content is less than about 10% of the atoms. The silicon nitride of second stratum 156 additionally provides a surface adapted to provide good adhesion to the scintillating medium deposited thereover.

In an alternative embodiment of this invention (not shown), photosensor barrier layer comprises only one stratum, which comprises silicon nitride. Such a layer typically has a thickness of between about 0.2 μm and 1 μm; except as noted herein, the device of the alternative embodiment is otherwise the same as that described elsewhere in the specification with respect to the two strata photosensor barrier layer device.

In the two strata barrier layer, typically the optical index of refraction of the silicon oxide first stratum is in the range between 1.4 and 1.5, and the optical index of refraction of the silicon nitride is in the range between about 1.8 and 2.3, and typically is about 2.0. Optical coupling between scintillator 180 and photosensor array 120 through two-strata barrier layer 150 has been measured to be comparable to the optical coupling achieved with a single layer of silicon nitride.

In the fabrication process the silicon oxide and silicon nitride layers of photosensor barrier layer 150 typically are deposited during the same vacuum pumpdown. It is further desirable to deposit the silicon oxide for first stratum 152 and the silicon nitride for second stratum 156 through a shadow mask to selectively deposit it only over the desired portion of upper conductive layer 136 so that the silicon oxide and silicon nitride are not deposited on areas, such as contact fingers, from which it must later may be removed in an etching process that may also result in the undesired removal of other layers of silicon oxide or silicon nitride that form portions of other components in imager array 100.

In accordance with this invention, the upper surface of photosensor barrier layer 150 is treated to improve adhesion between the silicon nitride (which, in either embodiment discussed above, comprises the upper surface of the barrier layer) and the scintillator material to be deposited thereover, as described below. The treatment of the silicon nitride surface typically comprises etching the silicon nitride surface 156 of barrier layer 150. For example, silicon nitride second stratum 156 is advantageously etched in a reactive ion etching (RIE) process using a mixture of trifluoromethane ($CHF_3$), argon (Ar), and oxygen ($O_2$). The ratio of the $CHF_3$, Ar, and $O_2$ is about 20:60:5, respectively, as can be determined by the flow rates (in sccm) of these gasses. Typical chamber pressure for this RIE process is about 50 mtorr with a power density of about 0.2 $W/cm^2$.

The etching process of the silicon nitride surface (second stratum 156) typically is run for a selected time to treat the surface sufficiently to provide the improved adhesion and so as to not remove more than a selected amount of material from silicon nitride surface. The etching process typically removes less than 500 Å of material from the silicon nitride surface, and is typically in the range of between about 200 Å to 500 Å (and commonly about 370 Å).

The etch treatment of the exposed silicon nitride surface of barrier layer 150 in accordance with this invention is preferably substantially selective to silicon oxide and indium tin oxide, which are other materials which, in the arrangement described herein, may be exposed at points on the array and thus exposed to the etch. The RIE etch described above, for example, is substantially selective to these materials, that is the etch rate of these material is less than about one-half the etch rate of the silicon nitride (the relative etch rate of silicon oxide to silicon nitride is about 0.4, and the relative etch rate of the indium tin oxide is about 0.02 to that of the silicon nitride).

Alternatively, other etch treatments can be applied to the silicon nitride upper surface of barrier 150 to prepare the surface prior to the deposition of the scintillator material thereover. For example, a wet etch of the surface using buffered hydrogen fluoride (BHF), or alternatively, an ion bombardment of the surface using argon (at an energy level of about 1 KW or less) can be used, although the RIE process generally more readily provides the desired etch selectivity and controllability of the etch (e.g., consistently reproducible etch rates).

After the upper silicon nitride surface of barrier 150 has been treated, scintillator 180 is deposited thereover. Scintillator 180 comprises a scintillating medium, such as cesium iodide, adapted to emit optical photons in response to the absorption of incident radiation of the type to be imaged. For example, for x-ray imagers, cesium iodide doped with thallium (CsI:Tl) is commonly used; alternatively, cesium iodide doped with sodium is used (CsI:Na). The cesium iodide is advantageously deposited on photosensor barrier layer 150 by evaporation in the form of needles 185; each needle is typically several microns in diameter and several hundred microns long. This aspect ratio in which the needle has a relatively long longitudinal axis compared to a relative short diameter provides a scintillator in which most optical photons emerge from the bottom of the scintillator (towards the photosensor array) such that they are efficiently optically coupled into the photosensor array; that is the majority of photons strike the photosensor barrier layer at sufficiently large angles of incidence so that substantially all photons pass into photosensor array 120 without being reflected at any of the following interfaces: between the scintillator material and the silicon nitride in second stratum 156; between the silicon nitride and the silicon oxide in first stratum 152; and between the silicon oxide and the upper conductive layer 136.

A radiation imager formed in accordance with this invention exhibits a robust structure that is resistant to mechanical degradation and that is resistant to attack by moisture. When barrier layer 150 is treated in accordance with this invention, barrier layer 150 and scintillator 180 exhibit superior adhesion to one another over an assembly in which the barrier layer is untreated. Not only does the structure pass the standard tape pull test (wherein the adhesive tape is applied to the structure and pulled off, as is known in the art) without delamination, there is little or no mechanical deterioration of the bond between scintillator 180 and barrier layer 150 even when the scintillator material is removed (for test purposes) and redeposited (after a dry bake of the photosensor array at about 150° C. to account for the effects of washing off the scintillator material). Thus, under normal operating conditions for the imager the structure will demonstrate excellent structural integrity and prove to be extremely strong.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating a mechanically robust amorphous silicon imager having strong adhesion between the scintillator and an underlying moisture barrier layer, comprising the steps of:
   forming a photosensor array on a substrate;
   depositing a photosensor array barrier over said photosensor array, said array barrier having an upper surface comprising silicon nitride, said silicon nitride having a thickness of more than 500 Å;
   treating the silicon nitride surface of said barrier layer to provide enhanced adhesion of the silicon nitride to a scintillator material to be deposited thereover and so as not to remove more than 500 Å of said silicon nitride surface; and depositing a scintillator material over the treated surface of the silicon nitride surface of said barrier layer.

2. The method of claim 1 wherein the step of treating said the silicon nitride surface of said barrier layer comprises reactive ion etching the silicon nitride surface.

3. The method of claim 2 wherein the step of reactive ion etching said silicon nitride surface of said barrier layer comprises the steps of exposing said silicon nitride surface to an etchant comprising a mixture of trifluoromethane ($CHF_3$), argon (Ar), and oxygen ($O_2$).

4. The method of claim 2 wherein the ratio of the mixture of $CHF_3$, Ar, and $O_2$ is approximately 20:60:5.

5. The method of claim 2 wherein the time for etching said silicon nitride surface is selected so as to not etch away more than 500 Å of said silicon nitride surface.

6. The method of claim 1 wherein the step of treating said silicon nitride surface of said barrier layer comprises an etching process that is substantially selective to indium tin oxide and silicon oxide.

7. The method of claim 1 wherein the step of treating the silicon nitride surface of said barrier layer comprises ion bombardment of said upper silicon nitride layer.

8. The method of claim 1 wherein the step of treating the silicon nitride surface of said barrier layer comprises wet etching said silicon nitride.

9. The method of claim 8 wherein the step of wet etching said silicon nitride comprises applying an etchant comprising buffered hydrogen fluoride (BHF).

10. The method of claim 1 wherein the step of depositing said scintillator material comprises evaporating cesium iodide over the treated silicon nitride surface.

* * * * *